Jan. 10, 1956 N. E. LINDENBLAD 2,729,949
CUMULATIVE COOLING SYSTEM
Filed Nov. 19, 1954
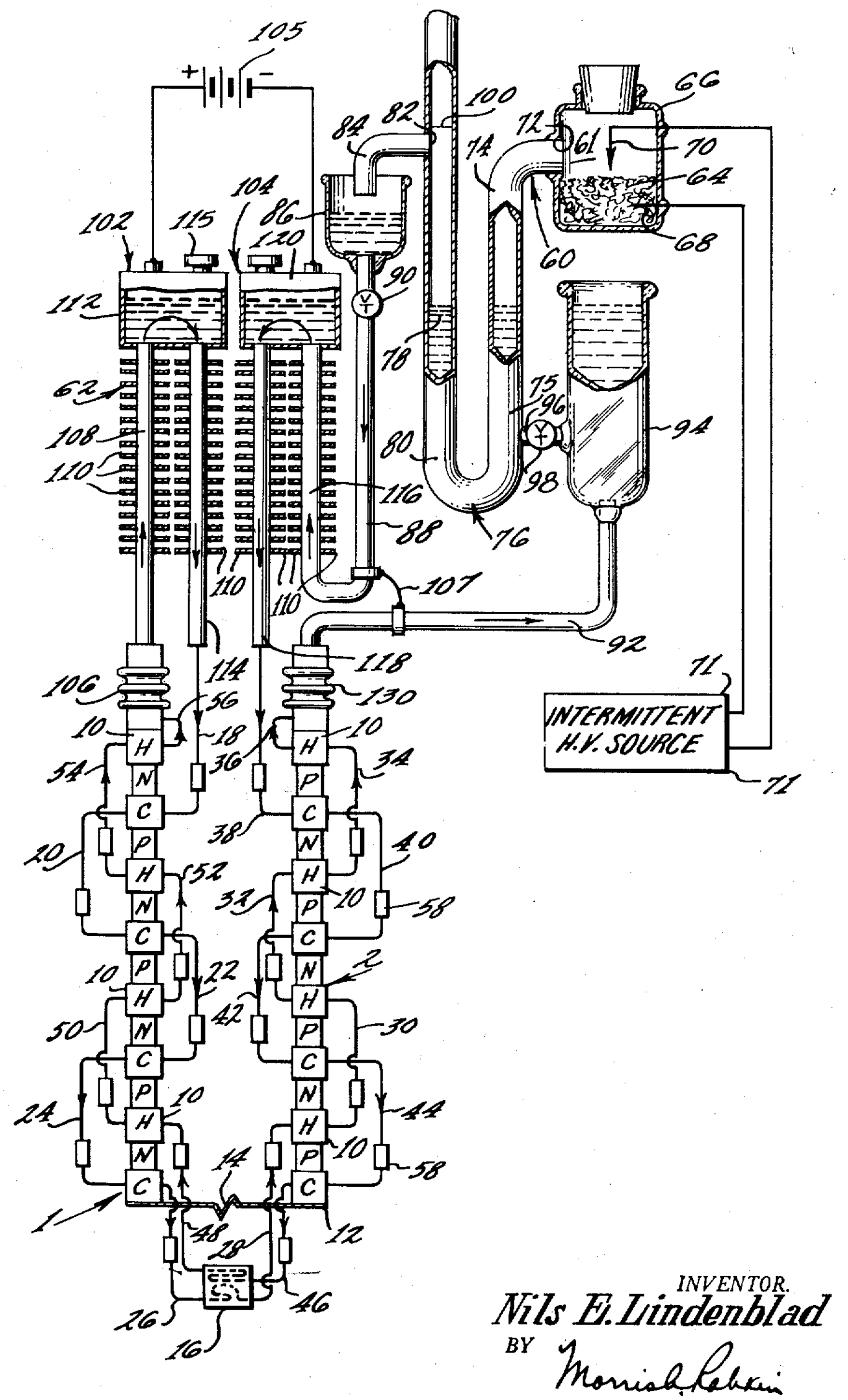
INVENTOR.
Nils E. Lindenblad
BY Morris ... [signature]
ATTORNEY.

United States Patent Office 2,729,949

Patented Jan. 10, 1956

2,729,949

CUMULATIVE COOLING SYSTEM

Nils E. Lindenblad, Princeton, N. J., assignor to Radio Corporation of America, a corporation of Delaware Application November 19, 1954, Serial No. 469,995

9 Claims. (Cl. 62—1)

This invention relates to refrigerating systems and more particularly to novel systems for refrigerating by means of the Peltier effect.

When a direct current is passed through a circuit which couples materials having dissimilar thermoelectric properties, one type of junction between the materials absorbs heat and another type of junction between the materials releases heat. These circuits are called thermocouples. This phenomenon is called the Peltier effect. These thermocouples may be utilized for cooling. At present, however, the temperature drop attainable by means of a thermocouple is limited. This affects the cooling range of a thermoelectric refrigerator.

An object of this invention is to provide a thermoelectric cooling system having an extended temperature range.

Another object is to provide a thermoelectric cooling system yielding a temperature drop in excess of that provided by a single thermocouple.

A further object is to provide an efficient thermoelectric cooling system utilizing no mechanical moving parts.

In accordance with this invention, a thermoelectric cooling system is made up of an array or a group of thermocouples. As a circulating fluid flows towards a cooling chamber, it is successively passed in heat exchange relationship with the cold junctions of this group. The cold fluid then flows through the cooling chamber in heat exchange relationship with a source of heat or material to be cooled. After the fluid has absorbed heat from the material to be cooled, it is still cool. The stream of cool fluid flowing away from the cooling chamber passes in heat exchange relationship with the hot junctions of the group of thermocouples. The cool fluid proceeds from the thermocouple nearest the cooling chamber to the thermocouple most remote from the cooling chamber. This provides a series of cumulative temperature drops in the fluid flowing towards the cooling chamber.

The warm fluid discharged from the hot junctions may be circulated in heat exchange relationship with a heat sink so that it may be cooled. When the warm fluid is cooled, it may be then recirculated through the system. A pump having no mechanical parts may be provided within the system for recirculating the fluid.

Other objects and advantages of the present invention will become apparent to one skilled in the art from a reading of the following description in conjunction with the accompanying schematic diagram of a cooling system showing an illustrative embodiment of the present invention.

Referring to the single figure, two groups of thermocouples are provided. They are designated for purposes of this description as group 1 and group 2 and are indicated on the drawing by general reference characters 1 and 2. These groups or arrays are made up of series-connected chains of materials having dissimilar thermoelectric properties. The materials are indicated by blocks designated by either P or N. The N and P nomenclature is prevalent in semi-conductor terminology at present, and is used herein for convenience in differentiating materials having dissimilar thermoelectric properties. An N material includes an abundance of electrons. A P material includes an abundance of electrons. A P material includes an abundance of electron vacancies or holes. A thermocouple is formed of an N type material joined to a P type material. When a direct current is run through a thermocouple in its positive direction from N to P, the junction between N and P materials becomes cold; and when the current runs from P to N, the junction between P and N type materials becomes hot. Bismuth may be used, for example, as an N type material; and antimony may be used, for example, as a P type material.

In this illustrative example, the N and P type materials are formed into two separate thermocouple chains. Blocks of thermally and electrically-conducting material 10, for example, of copper, are used to form junctions between these materials. These blocks are designated H and C to indicate whether they form a hot junction (H) or a cold junction (C) when a direct-current is passed through the series-connected chain in the indicated direction. Means, later to be described, are provided to cause this current to pass through the chains of thermocouples. Within the spirit of this invention, these thermocouple chains or groups may also be formed of individual thermocouples. In the embodiment herein described, the series-connected chain of P and A materials is utilized to provide simplicity of connection. A single group or chain of thermocouples also may be utilized within the spirit of this invention.

One chain is connected to the other through a connecting strip 12. This strip is made of electrically conducting material to carry current from one series-connected chain to the other. It has a stress absorbing loop or corrugation 14 to prevent mechanical stresses from being transmitted from one chain to the other. The strip 12, may for example, be made of copper. A cooling chamber or terminal 16 is provided adjacent the connected portions of these chains. The chamber 16 is large enough to hold a quantity of material to be cooled. Heat is absorbed from the material within this chamber. The chamber may, therefore, be described as a source of heat or merely as a source.

A conduit system is provided to conduct a heat transfer fluid successively through the cold junctions of one of the groups or chains toward the source or cooling chamber 16. The conduit systems then conduct the fluid in heat exchange relationship with the source 16. A portion of this conduit system is designated by conduits or tubes 18, 20, 22, 24, and 26. This portion of the system conducts a fluid successively through and in heat exchange relationship with the cold junctions of chain or group 1. After the fluid has passed in heat exchange relationship with the source or chamber 16, it is conducted away from the chamber 16 and then conducted in heat exchange relationship successively with the hot junctions of the chain or group 2. The portion of the system conducting the fluid away from the cooling chamber 16 is made up successively of conduits 28, 30, 32, 34 and 36.

As this conduit system proceeds successively through conduits 18 to 26, toward the source or cooling chamber 16, the fluid is cumulatively cooled to lower temperatures by each successive cold junction. After leaving the chamber 16; the fluid, even though it has absorbed some heat from the source, is still cool. It then passes through conduits 28 to 36 in heat exchange relationship with the successive hot junctions of chain or group 2. The fluid proceeds from the hot junction of the thermocouple in a position nearest the cooling chamber 16 in the conduit system to the hot junction of the thermocouple in a position most remote from the cooling chamber in the conduit system. This provides progressively lower temperatures in the cold junctions as the cooling chamber is approached. Conduits 38, 40, 42, 44 and 46 conduct fluid through the cold junctions of chain or group 2 to the cold chamber 16. The cool fluid from chamber 16 then passes through conduits 48, 50, 52, 54 and 56 successively, and through the hot junctions of chain 1. It cools these hot junctions in an order proceeding from the thermocouple nearer to the chamber to the thermocouple more remote from the chamber. Tubes 58 of electrically insulating material are inserted in each of the conduits to prevent short-circuiting of the direct current flowing through the chains. These tubes may be rubber tubes while the conduits may be copper tubing.

The fluid circulating through the cold junctions is, therefore, cumulatively cooled as it approaches the cooling chamber 16. The hot junctions closest to the cooling chamber receive the cool fluid before it has become very warm. The hot junctions remote from the cooling chamber receive the fluid after it has been warmed by successive heat exchanges with several of the hot junctions. The fluid circulating towards the cooling chamber is successively cooled to lower and lower temperatures by heat exchange with colder and colder cold junctions as the cooling chamber is approached. A portion of the cooling work or total temperature drop is, therefore, accomplished in each of the cold junctions. The terms "nearer" or "remote from the cooling chamber" refer to the position of the thermocouple in the circulating system and not to the physical location. The position in the circulating system is also referred to by the term "approaching the cooling chamber." The cumulative temperature drops may be used to provide great overall temperature drops in the fluid.

This circulating fluid may be tap water which is continuously supplied under pressure at the initial cold junctions of each of the chains. After this water has been discharged from the final hot junction, it might be discharged from the system. A system of this type would require a continuous supply of tap water. This amount of water might be prohibitive. Necessity for a continuous supply of tap water is eliminated by use of a closed system.

To provide a closed system, a pump 60 and a heat exchanger 62 are provided. The circulating fluid discharged from the system is recirculated by the pump. The heat exchanger provides a means for transferring the heat absorbed at the hot junctions to a heat sink. In this embodiment, there is provided an electronic cooling system having no mechanical moving parts.

The pump 60 is made up of a fluid tight chamber 61. An adsorbing material 64, steel wool for example, adsorbs gas, air for example, contained within this chamber. The wall 66 of the chamber is made of electrical insulating material, for example, glass. A pair of electrodes 68 and 70 pass through the wall 66 of the chamber. The electrode 68 is electrically connected to the steel wool 64 within the chamber. The electrode 70 may be described as a corona discharge point and is disposed at a corona forming distance from the steel wool 64. The electrodes are connected across an intermittent high voltage source 71, which may, for example, be 12,000 volts. The chamber 61 has an outlet 72 connected to a conduit 74. The conduit 74 connects the chamber 61 to the leg 75 of a U-tube or manometer 76. A liquid 78, water for example, lies within the U-tube. The leg 80 of the U-tube remote from the chamber has an overflow means 82 located at a point higher than the normal liquid level. Overflowing water is directed by means of a spout 84 to flow into a funnel 86 from which it flows into the system through a conduit 88. A throttling valve 90 is provided in the conduit 88 below the funnel to regulate the flow of liquid from the pump to the system. The liquid returning from the system flows from a conduit 92 into a reservoir 94. This reservoir communicates with the leg 75 of the U-tube 76 through a conduit 96. A throttling valve 98 within conduit 96 allows fluid to be stored within the reservoir to build up a head to cause the fluid to flow into the leg.

When the intermittent high voltage source energizes and deenergizes the electrodes 68 and 70, a stream of ions from the discharge point 70 intermittently impinges upon the steel wool within the chamber. When the ions impinge upon the steel wool they release the gas that is adsorbed by the wool. This increases the pressure within the chamber. As the pressure increases, it acts on the fluid within the U-tube or manometer 76 in a direction to raise the level in the leg 80 remote from the chamber. The level in the leg 80 is raised to a level indicated by the line 100. This level is above the overflow 82. At this time, liquid flows from the spout 84 into the funnel 86 to be returned to the arrays of thermocouples with sufficient head to flow completely through it.

This electronic pump 60 is described and claimed in copending application for Letters Patent, Serial No. 469,896 filed by this same inventor on November 19, 1954.

A heat exchanger 62 is provided for carrying heat away from the warm fluid discharged from the hot junctions before it is recirculated through the cold junctions. This heat exchanger is made up of two separate units 102 and 104. The fluid from chain 1 flows into heat exchanger 102 through expansion joint 106 which may be of any well known type. The warm fluid then flows through conduit 108. Conduit 108 has fins 110 to increase its heat transferring surface. After flowing through conduit 108, the fluid flows into a return header 112 where it is directed to flow down through a conduit 114 which also has heat transferring fins 110. A heat absorbing medium is circulated in heat exchange relationship with the heat exchanger. This heat absorbing medium may be a flow of air. The header 112 includes a filling plug 115 so that the fluid level in the system may be maintained above conduits 108 and 114. The other heat exchanger 104 is similar to 102 and includes finned conduits 116 and 118. The header of heat exchanger 104 is designated by reference character 120. A source of direct current 105 is connected across these headers. A conducting link 107 connects the tube 88 leading into heat exchanger 104 with tube 92 leading into reservoir 94. This provides a complete electric circuit through chain 1 and chain 2 in series.

The warm fluid flowing from chain 1 flows through heat exchanger 102 where it is cooled by the flow of air. On leaving heat exchanger 102, the fluid flows through the cold junctions of chain 1 and through cooling chamber 16. The cooled fluid then flows through the hot junctions of chain 2. From the hot junctions of chain 2, the fluid flows through the expansion joint 130 to conduit 92 leading to reservoir 94 of the pump 60. From pump 60, the fluid is recirculated to the conduit 116 of heat exchanger 104. It is still warm. It is then cooled by the flow of air through the finned tubes 116 and 118 of heat exchanger 104. After flowing through heat exchanger 104, the fluid flows successively through the cold junctions of chain 2 to be cooled. After cooling the material in the cooling chamber 16, the cool fluid passes through the hot junctions of chain 1 to absorb heat from them. After passing through these hot junctions, the warm fluid enters the heat exchanger 102 to be cooled as previously described. The flow of fluid recirculates in continuous cycle as herein described.

What is claimed is:

1. A cumulative cooling system comprising an array of thermocouples having hot junctions and cold junctions, a source of heat, means for passing a fluid successively in heat exchange relationship with said cold junctions of said array to cool said fluid, means for passing said cooled fluid in heat exchange relationship with said source to absorb heat therefrom, and means for passing said fluid passed in heat exchange relationship with said source successively in heat exchange relationship with said hot junctions of said array to carry away heat from said hot junctions at varying temperatures to cause said cold junctions to absorb heat at varying temperatures.

2. A cumulative cooling system comprising an array of themocouples having hot junctions and cold junctions, a source of heat, means for passing a fluid in a successive order in heat exchange relationship with said cold junctions of said array to cool said fluid, means for passing said cooled fluid in heat exchange relationship with said source to absorb heat therefrom thereby heating said fluid, and means for passing said heated fluid in heat exchange relationship with said hot junctions of said array successively and in a direction opposite to said successive order of passage of said fluid with respect to said cold junctions whereby to carry away heat from said hot junctions at varying temperatures to cause said cold junctions to absorb heat at varying temperatures.

3. A cumulative cooling system comprising an array of thermocouples having hot junctions and cold junctions, a source of heat, means for passing a fluid successively in heat exchange relationship with said cold junctions to cool said fluid, means for passing said cooled fluid in heat exchange relationship with said source to absorb heat therefrom, and means for passing said fluid from said source successively in heat exchange relationship with said hot junctions of said array in an order proceeding from a thermocouple relatively nearer said source to a thermocouple relatively more remote from said source.

4. A cumulative cooling system comprising an array of thermocouples having hot junctions and cold junctions, a source of heat, a circulating system for passing a fluid successively in heat relationship with said cold junctions to cool said fluid, means for passing said cooled fluid in heat exchange relationship with said source, a return system for passing said fluid from said source successively in heat exchange relationship with the hot junctions of said array to carry away heat from said hot junctions at varying temperatures, and said return system for passing said fluid in heat exchange relationship with said hot junctions proceeding from the thermocouples in a position in said circulating system relatively nearer to said source to thermocouples in a position in said circulating system relatively more remote from said source.

5. A cumulative cooling system comprising an array of thermocouples having hot junctions and cold junctions, a source of heat, means for passing a fluid successively in heat exchange relationship with said cold junctions to cool said fluid, means for passing said cooled fluid in heat exchange relationship with said source to absorb heat therefrom, means for passing said fluid from said source successively in heat exchange relationship with the hot junctions of said array in an order proceeding from a thermocouple relatively nearer said source to a thermocouple relatively further from said source to carry away heat from said hot junctions at temperatures decreasing as said source is approached, means for passing said fluid from said hot junctions in heat exchange relationship with a sink to cool said fluid, and means for recirculating said fluid continuously through said array.

6. A thermoelectric cooling system comprising materials having dissimilar thermoelectric properties, junction means joining said materials in a series-connected chain in a manner to provide alternate hot junctions and cold junctions, means for passing a circulating fluid successively in heat exchange relationship with the cold junctions of said chain to cool said fluid, a cooling chamber, means for passing the cooled fluid from said chain in heat exchange relationship with said cooling chamber, and means for passing said fluid from said cooling chamber successively in heat exchange relationship with the hot junctions of said chain to absorb heat from said hot junctions at varying temperatures.

7. A thermoelectric cooling system comprising materials having dissimilar thermoelectric properties, junction means joining said materials in series-connected chains in a manner to provide alternate hot junctions and cold junctions in each of said chains, means for passing a circulating fluid successively in heat exchange relationship with the cold junctions of each of said chains to cool said fluid, a cooling chamber, means for passing said cooled fluid from each of said chains in heat exchange relationship with said cooling chamber, and means for passing said fluid from said cooling chamber successively in heat exchange relationship with the hot junctions of a chain other than the chain where it was cooled to carry away heat from the hot junctions of said chain at varying temperatures.

8. A thermoelectric cooling system comprising materials having dissimilar thermoelectric properties, junction means joining said materials in a series-connected chain in a manner to provide alternate hot junctions and cold junctions, means for passing a circulating fluid successively in heat exchange relationship with the cold junctions of each of said chains to cool said fluid, a cooling chamber, means for passing the cooled fluid from said chain in heat exchange relationship with said cooling chamber, and means for passing said fluid from said cooling chamber successively in heat exchange relationship with the hot junctions of said chain in an order proceeding from hot junctions relatively nearer said cooling chamber to hot junctions relatively more remote from said cooling chamber to cause said cold junctions relatively nearer said cooling chamber to absorb heat at temperatures relatively lower than said cold junctions relatively more remote from said cooling chamber.

9. A thermoelectric cooling system comprising materials having dissimilar thermoelectric properties, junction means joining said materials in a series-connected chain in a manner to provide alternate hot junctions and cold junctions in said chain, means for passing a circulating fluid successively in heat exchange relationship with the cold junctions of said chain to cool said fluid, a cooling chamber, means for passing the cooled fluid from said chain in heat exchange relationship with said cooling chamber, means for passing said fluid from said cooling chamber successively in heat exchange relationship with the hot junctions of said chain to absorb heat from said hot junctions at varying temperatures, a sink, means for passing said fluid from said hot junctions in heat exchange relationship with said sink to cool said fluid, and means for recirculating said fluid from said sink through said chain.

References Cited in the file of this patent

UNITED STATES PATENTS

| | | |
|---|---|---|
| 1,120,781 | Altenkirch et al. | Dec. 15, 1914 |
| 1,818,437 | Stuart | Aug. 11, 1931 |
| 2,050,391 | Spencer | Aug. 11, 1936 |